United States Patent
Kwon et al.

(10) Patent No.: US 9,435,053 B2
(45) Date of Patent: Sep. 6, 2016

(54) APPARATUS FOR MANUFACTURING INGOT

(71) Applicants: Hyun Goo Kwon, Uiwang (KR); Yeo Kyun Yoon, Hwaseong (KR); Min Soo Son, Seoul (KR)

(72) Inventors: Hyun Goo Kwon, Uiwang (KR); Yeo Kyun Yoon, Hwaseong (KR); Min Soo Son, Seoul (KR)

(73) Assignee: TECHNOVALUE CO., LTD., Seoul (KR)

( * ) Notice: Subject to any disclaimer, the term of this patent is extended or adjusted under 35 U.S.C. 154(b) by 351 days.

(21) Appl. No.: 14/257,163

(22) Filed: Apr. 21, 2014

(65) Prior Publication Data
US 2015/0259821 A1    Sep. 17, 2015

(30) Foreign Application Priority Data

Mar. 11, 2014    (KR) .......................... 10-2014-0028419

(51) Int. Cl.
  *C30B 15/02*    (2006.01)
  *C30B 15/00*    (2006.01)
  *C30B 29/06*    (2006.01)
  *C30B 15/12*    (2006.01)
(52) U.S. Cl.
  CPC ............. *C30B 15/002* (2013.01); *C30B 15/02* (2013.01); *C30B 15/12* (2013.01); *C30B 29/06* (2013.01); *Y10T 117/1056* (2015.01)
(58) Field of Classification Search
  CPC ................ C30B 15/002; C30B 15/02; Y10T 117/1052; Y10T 117/1056
  See application file for complete search history.

(56) References Cited

U.S. PATENT DOCUMENTS

| 5,037,503 | A | * | 8/1991 | Kajimoto ................ C30B 29/06 117/31 |
| 5,087,321 | A | | 2/1992 | Kamio et al. |
| 5,087,429 | A | | 2/1992 | Kamio et al. |
| 5,139,750 | A | | 8/1992 | Shima et al. |
| 5,242,531 | A | | 9/1993 | Klingshirn et al. |
| 5,474,022 | A | | 12/1995 | Abe et al. |
| 5,891,245 | A | | 4/1999 | Atami et al. |
| 6,277,192 | B1 | | 8/2001 | Altekruger et al. |
| 7,635,414 | B2 | | 12/2009 | Bender |
| 8,262,797 | B1 | | 9/2012 | Bender et al. |
| 2005/0279277 | A1 | * | 12/2005 | Holder ...................... B07B 4/04 117/19 |
| 2012/0060748 | A1 | | 3/2012 | Corbeil et al. |
| 2012/0266808 | A1 | | 10/2012 | Luter et al. |
| 2012/0279437 | A1 | | 11/2012 | Johnson |
| 2013/0133567 | A1 | | 5/2013 | Bender |

OTHER PUBLICATIONS

"A new technique for controlling the dopant concentration in the double-crucible method," Naoki Ono et al, Journal of Crustal Growth 135 (1994) pp. 359-364, North-Holland.

* cited by examiner

*Primary Examiner* — Robert M Kunemund
(74) *Attorney, Agent, or Firm* — Patent Office of Dr. Chung Park (57) ABSTRACT

Disclosed is an ingot manufacturing apparatus that includes: a chamber; a crucible which is disposed within the chamber and has a melting zone where silicon particles are melted; an inner wall which is disposed within the crucible and has a growth zone where an ingot grows from molten silicon introduced from the melting zone; a feeding part which supplies the silicon particles and sweeping gas to the inside of the chamber; and a suction part which surrounds the feeding part and discharges the sweeping gas supplied through the feeding part to the outside of the chamber.

21 Claims, 10 Drawing Sheets

APPARATUS FOR MANUFACTURING INGOT

CROSS-REFERENCE TO PRIOR APPLICATIONS

This application claims priority under 35 U.S.C. §119 from Korean Application No. 10-2014-0028419 filed on Mar. 11, 2014, the subject matter of which is incorporated herein by reference in its entirety.

BACKGROUND OF THE DISCLOSURE

1. Field of the Disclosure

The present invention relates to an apparatus for manufacturing an ingot.

2. Description of the Related Art

An ingot is important in the manufacture of a semiconductor chip or a solar cell. The ingot is manufactured during a process of melting and solidifying silicon in a crucible.

The ingot is manufactured by Czochralski method in which, while a rod or a seed crystal which has penetrated molten silicon is slowly lifted, the silicon attached in the vicinity of the rod or the seed crystal is solidified.

Recently, research is being devoted to an ingot manufacturing apparatus using a continuous Czochralski method capable of a plurality of ingots by continuously supplying the silicon.

SUMMARY

One embodiment is an ingot manufacturing apparatus that includes: a chamber; a crucible which is disposed within the chamber and has a melting zone where silicon particles are melted; an inner wall which is disposed within the crucible and has a growth zone where an ingot grows from molten silicon introduced from the melting zone; a feeding part which supplies the silicon particles and sweeping gas to the inside of the chamber; and a suction part which surrounds the feeding part and discharges the sweeping gas supplied through the feeding part to the outside of the chamber.

A distance from a surface of the molten silicon to an end of the feeding part may be the same as or greater than a distance from the surface of the molten silicon to an end of the suction part.

The suction part and the feeding part may have the same central axis.

A supply rate of the sweeping gas which is supplied from the feeding part may be substantially the same as or less than a suction rate of the sweeping gas which is discharged through the suction part.

Silicon dust having a diameter less than a diameter of the silicon particle may be introduced within the chamber through the feeding part, and the suction part may discharge the silicon dust to the outside of the chamber.

The suction part may discharge not only the silicon dust but silicon oxide within the chamber to the outside of the chamber.

A distance between an end of the feeding part and an inner surface of the suction part may be less than a distance between the inner surface of the suction part and an outer surface of the feeding part in an area where the feeding part is bent within the chamber.

Some of the sweeping gas may be discharged to the suction part through a through-hole formed in a side of the feeding part, and a diameter of the through-hole may be less than a diameter of an end of the feeding part.

The ingot manufacturing apparatus according to the embodiment of the present invention may further include a divider which divides a suction space between the suction part and an end of the feeding part into a plurality of spaces by connecting an inner surface of the suction part and an outer surface of the feeding part.

The suction part may include a plurality of units, and each of the units may be connected to an outer surface of the feeding part.

A temperature of the sweeping gas passing an end of the feeding part may be lower than a temperature of the inside of the chamber.

Another embodiment is an ingot manufacturing apparatus that includes: a chamber; a crucible which is disposed within the chamber and has a melting zone where silicon particles are melted; an inner wall which is disposed within the crucible and has a growth zone where an ingot grows from molten silicon introduced from the melting zone; a feeding part which supplies the silicon particles and sweeping gas to the inside of the chamber; and a suction part which is disposed within the feeding part and discharges the sweeping gas supplied through the feeding part to the outside of the chamber.

A distance from a surface of the molten silicon to an end of the suction part may be the same as or greater than a distance from the surface of the molten silicon to an end of the feeding part.

The suction part and the feeding part may have the same central axis.

A supply rate of the sweeping gas which is supplied from the feeding part may be substantially the same as or less than a suction rate of the sweeping gas which is discharged through the suction part.

Silicon dust having a diameter less than a diameter of the silicon particle may be introduced within the chamber through the feeding part, and the suction part may discharge the silicon dust to the outside of the chamber.

The suction part may discharge not only the silicon dust but silicon oxide within the chamber to the outside of the chamber.

A diameter of an end of the suction part may be less than a diameter of the suction part in an area where the feeding part is bent within the chamber.

Some of the sweeping gas may be discharged to the suction part through a through-hole formed in a side of the suction part, and a diameter of the through-hole may be less than a distance between an inner surface of the feeding part and an outer surface of the suction part.

A temperature of the sweeping gas passing an end of the feeding part may be lower than a temperature of the inside of the chamber.

Further another embodiment is an ingot manufacturing apparatus that includes: a chamber; a crucible which is disposed within the chamber and has a melting zone for silicon particles are melted; an inner wall which is disposed within the crucible and has a growth zone where an ingot grows from molten silicon introduced from the melting zone; a feeding part which supplies the silicon particles and sweeping gas to the inside of the chamber; a suction part which discharges the sweeping gas supplied through the feeding part to the outside of the chamber, surrounds the feeding part or is disposed within the feeding part; a communicating tube which communicates the inside of the chamber and the suction part and provides a flow path through which the sweeping gas moves to the outside of the chamber; a main filter which filters dusts included in the sweeping gas moving through the communicating tube; and a main pump which provides a pressure required for the sweeping gas to move through the communicating tube.

DETAILED DESCRIPTION OF EXEMPLARY EMBODIMENTS

Hereafter, an embodiment of the present invention will be described in detail with reference to accompanying drawings. However, the accompanied drawings are provided only for more easily describing the present invention. It is easily understood by those skilled in the art that the spirit and scope of the present invention is not limited to the scope of the accompanied drawings.

Terms used in the present specification are provided for description of only specific embodiments of the present invention, and not intended to be limiting. An expression of a singular form includes the expression of plural form thereof unless otherwise explicitly mentioned in the context.

In the present specification, it should be understood that the term "include" or "comprise" and the like is intended to specify characteristics, numbers, steps, operations, components, parts or any combination thereof which are mentioned in the specification, and intended not to previously exclude the possibility of existence or addition of at least one another characteristics, numbers, steps, operations, components, parts or any combination thereof.

Figure 1:
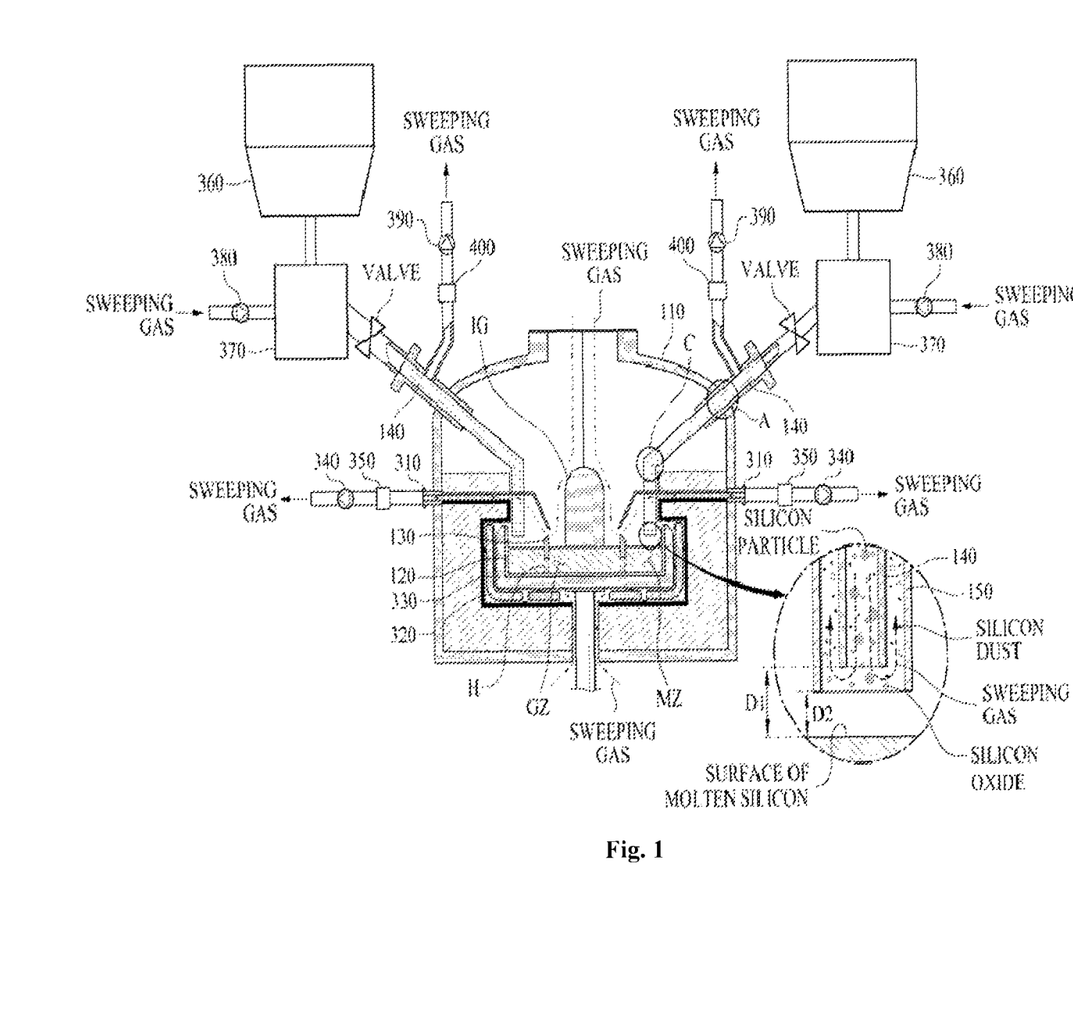
FIG. 1 shows an ingot manufacturing apparatus according to a first embodiment of the present invention.

FIG. 1 shows an ingot manufacturing apparatus according to a first embodiment of the present invention. As shown in FIG. 1, the ingot manufacturing apparatus according to the embodiment of the present invention includes a chamber 110, a crucible 120, an inner wall 130, a feeding part 140, and a suction part 150.

The ingot manufacturing apparatus according to the embodiment of the present invention may use Continuous Czochralski method (hereafter, referred to as CCz method) capable of intermittently or continuously supplying silicon particles through the feeding part 140 during the growth of an ingot IG.

The chamber 110 isolates an inner space from the outside in order to provide an environment for melting the silicon particles and growing the ingot IG.

The crucible 120 is disposed within the chamber 110 and has a melting zone where the silicon particles are melted. Here, the melting zone may correspond to an area between the crucible 120 and the inner wall 130. The crucible 120 may be formed of quartz capable of preventing the silicon particles and the ingot IG from being contaminated and of enduring a high temperature environment. However, the crucible 120 is not limited to this.

The inner wall 130 is disposed within the crucible 120 and includes a growth zone where the ingot IG grows from the molten silicon introduced from the melting zone. The inner wall 130 may be also formed of the quartz capable of preventing the contaminated and of enduring the high temperature environment. However, inner wall 130 is not limited to this.

The feeding part 140 supplies the silicon particles and sweeping gas to the inside of the chamber 110. The sweeping gas may include Ar, $N_2$, and He and is not limited to this. The feeding part 140 intermittently or continuously supplies the silicon particles to the melting zone during the growth of the ingot IG, so that a plurality of the ingots IG can be manufactured. The feeding part 140 may have a pipe shape or a tubular shape and is not limited to this.

Silicon oxide may be generated on the surface of the molten silicon during the growth of the ingot IG. That is, when the crucible 120 made of $SiO_2$ meets the high temperature molten silicon, oxygen is dissolved from the crucible 120, and the oxygen reacts with the molten silicon, so that the silicon oxide may be generated. Most of the silicon oxide may be discharged in the form of gas through the surface of the molten silicon. The silicon oxide may be deposited on the feeding part 140.

Since the silicon oxide deposited on the feeding part 140 increases with the lapse of time, the silicon oxide may hinder or prevent the supply of the silicon particles. In the ingot manufacturing apparatus according to the first embodiment of the present invention, the sweeping gas as well as the silicon particles is supplied through the feeding part 140, so that it is possible to prevent the silicon oxide from being deposited on the feeding part 140.

Here, the temperature of the sweeping gas passing the end of the feeding part 140 may be lower than the temperature of the inside of the chamber 110. In other words, the sweeping gas cools the feeding part 140, thereby preventing the silicon oxide from being deposited on the feeding part 140.

The silicon particle is melted at around 1,420° C. Therefore, the ingot IG grows in the high temperature internal environment of the chamber 110. The silicon oxide is deposited by the high temperature environment of the chamber 110, preventing the silicon oxide from being deposited on the feeding part 140 because the sweeping gas cools the feeding part 140.

The suction part 150 surrounds the feeding part 140 and discharges the sweeping gas supplied through the feeding part 140 to the outside of the chamber 110. Not only the silicon particle but silicon dust having a diameter less than a diameter of the silicon particle may be introduced within the chamber 110. For example, the silicon dust may have a diameter less than 10 percent of the average diameter of the silicon particle.

The silicon dust may be included in the material itself and may be formed by various causes like collision of the silicon particles during the supply.

The silicon dust introduced within the chamber 110 moves to the growth zone, and thus may interrupt the growth of the ingot IG. For the purpose of preventing this, the suction part 150 is able to discharge the silicon dust to the outside of the chamber 110.

As shown in FIG. 1, since the sweeping gas is supplied from the feeding part 140 and is discharged to the outside of the chamber 110 through the suction part 150, a flow of the sweeping gas may be created between the feeding part 140 and the suction part 150.

The silicon particle is heavier than the silicon dust. Therefore, the silicon particle can be supplied to the crucible 120 out of the flow of the sweeping gas. Contrarily, since the silicon dust is lighter than the silicon particle, the silicon dust can be discharged through the feeding part 140 to the suction part 150 along the flow of the sweeping gas. As a result, the silicon dust is prevented from being introduced within the chamber 110, so that the ingot IG can be stably grown.

Here, the suction part 150 is able to discharge not only the silicon dust but the silicon oxide within the chamber 110 to the outside of the chamber 110. As described above, the silicon oxide may be generated on the surface of the molten silicon during the manufacturing process of the ingot IG, and may be distributed in the inner space of the chamber 110.

When the sweeping gas flows from the feeding part 140 to the suction part 150, the silicon oxide in the vicinity of the feeding part 140 may be also discharged to the outside of the chamber 110 along the flow of the sweeping gas. Therefore, the flow of the sweeping gas can prevent the silicon oxide from being deposited on the feeding part 140.

As shown in FIG. 1, a distance D1 from the surface of the molten silicon to the end of the feeding part 140 may be the same as or greater than a distance D2 from the surface of the molten silicon to an end of the suction part 150.

Figure 2:
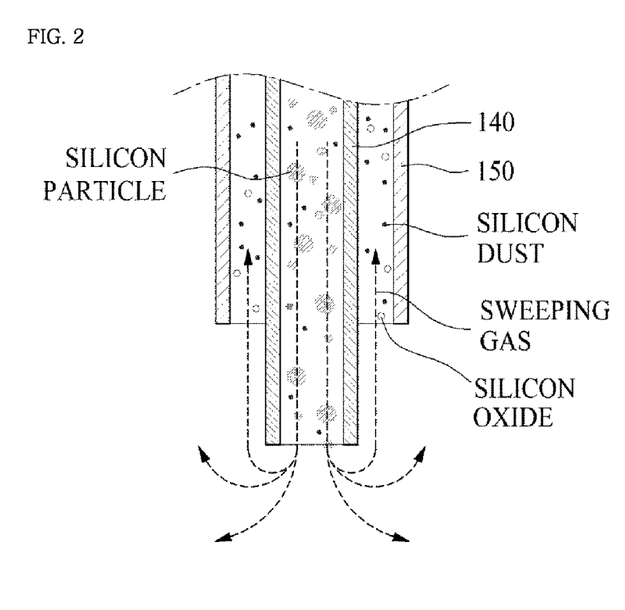
FIG. 2 shows a comparison example of a feeding part and a suction part of FIG. 1.

Unlike this, when D1 is less than D2, as shown in FIG. 2, some of the sweeping gas may flow within the chamber 110 instead of the suction part 150, so that the silicon dust may be introduced within the chamber 110.

The suction part 150 and the feeding part 140 may have the same central axis, and accordingly, they may have a coaxial double tube structure.

Meanwhile, as shown in FIG. 1, the sweeping gas may be introduced within the chamber 110 through the tops and bottoms of the chamber 110 as well as the feeding part 140.

In other words, the sweeping gas which is introduced from the top of the chamber 110 removes the silicon oxide generated on the surface of the molten silicon and discharges through an outlet 310 formed on the side of the chamber 110.

As such, the sweeping gas which is introduced from the top of the chamber 110 is mixed with the silicon oxide. Then, the silicon oxide mixed with the sweeping gas is deposited on the surface of a heater 320 made of graphite, and thus, may decreasing the efficiency of the heater 320.

Accordingly, the sweeping gas which is introduced from the bottom of the chamber 110 moves in a reverse direction to a direction in which the sweeping gas including the silicon oxide flows, so that the sweeping gas including the silicon oxide can be prevented from contacting with graphite parts.

Besides, the sweeping gas introduced from the top may pass through the chamber 110 and be discharged to an outlet (not shown) of the bottom of the chamber 110.

The sweeping gas introduced from the bottom of the chamber 110 may be also discharged through the outlet 310 to the outside of the chamber 110.

As described above, the sweeping gas introduced from the top of the chamber 110 sweeps the surface of the molten silicon while moving to the outlet 310. The more uniformly the sweeping gas is distributed with respect to both the entire melting zone and growth zone, the more the removal efficiency of the silicon oxide may be achieved.

Here, the sweeping gas supplied through the feeding part 140 may decrease the uniformity of the sweeping gas distribution within the chamber 110. In order to prevent the decrease of the distribution uniformity, in the ingot manufacturing apparatus according to the first embodiment of the present invention, the supply rate of the sweeping gas which is supplied from the feeding part 140 may be substantially the same as or less than the suction rate of the sweeping gas which is discharged through the suction part 150.

As a result, since most of the sweeping gas which is supplied through the feeding part 140 is discharged to the outside of the chamber 110 through the suction part 150, it is possible to reduce the influence of the sweeping gas supplied through the feeding part 140 on the uniformity of the sweeping gas distribution within the chamber 110.

Meanwhile, the feeding part 140 and the suction part 150 may have various shapes.

Figure 3:
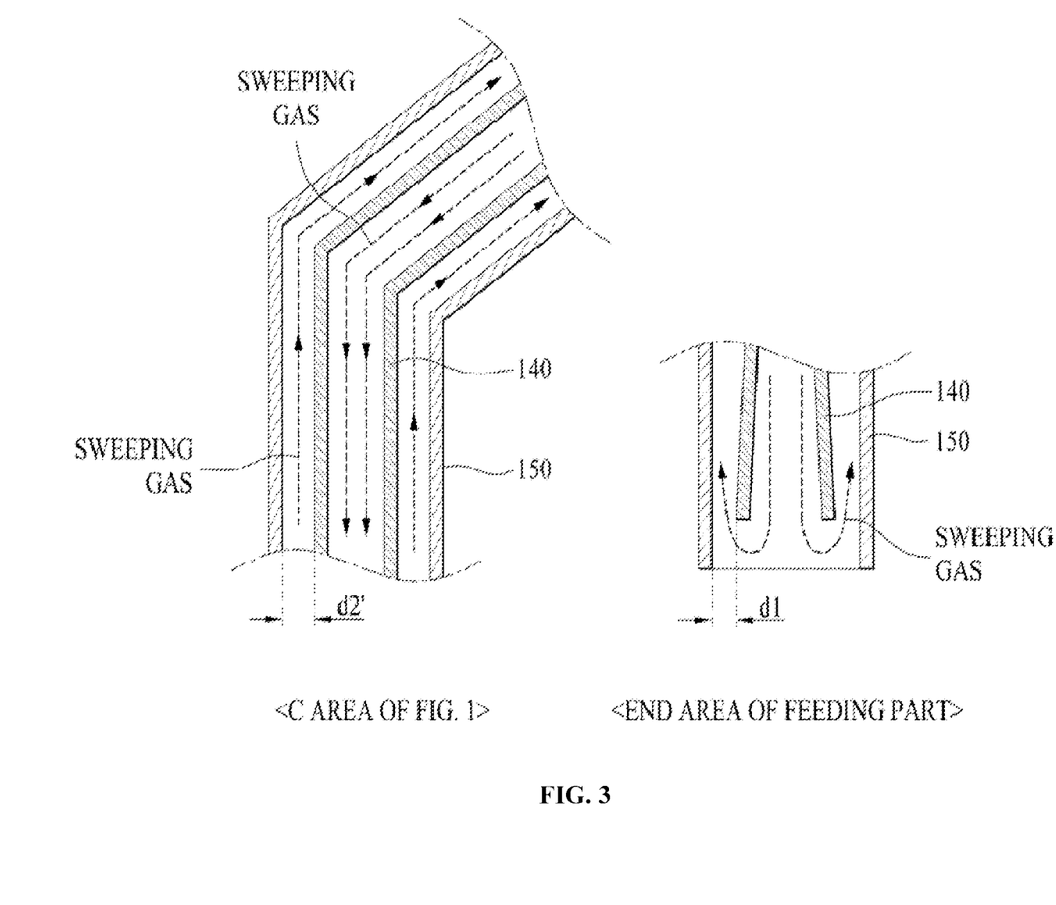
FIGS. 3 to 6 show modified examples of the feeding part of the ingot manufacturing apparatus according to the first embodiment of the present invention.

A distance d1 between the end of the feeding part 140 and the inner surface of the suction part 150 of FIG. 3 may be less than a distance between the inner surface of the suction part 150 and the outer surface of the feeding part 140 in the area "A" of the suction part 150 shown in FIG. 1, which passes through the chamber 110.

Otherwise, as shown in FIG. 3, the distance d1 may be less than a distance d2' between the inner surface of the suction part 150 and the outer surface of the feeding part 140 in the area "C" of FIG. 1 where the feeding part 140 is bent within the chamber 110.

As a result, a cross sectional area between the end of the feeding part 140 and the inner surface of the suction part 150 is reduced, so that negative pressure is formed on the end of the feeding part 140, thereby improving the effect of removing the silicon dust, silicon oxide and other dusts.

Figure 4:
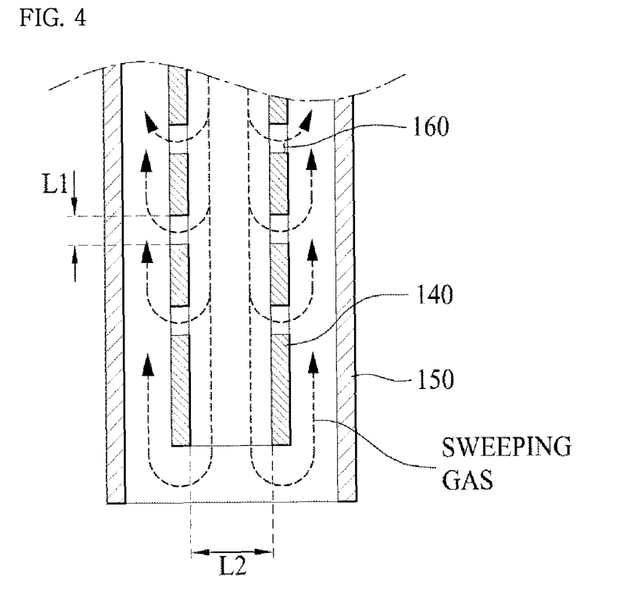

As shown in FIG. 4, some of the sweeping gas may be discharged to the suction part 150 through a through-hole 160 formed in the side of the feeding part 140. A diameter L1 of the through-hole 160 may be less than a diameter L2 of the end of the feeding part 140.

Due to the formation of the through-hole 160, sweeping gas flow path can be diversified. Since the sweeping gas passes through a narrow area such as the through-hole 160, it is possible to efficiently remove the silicon dust, silicon oxide and other dusts.

Figure 5:
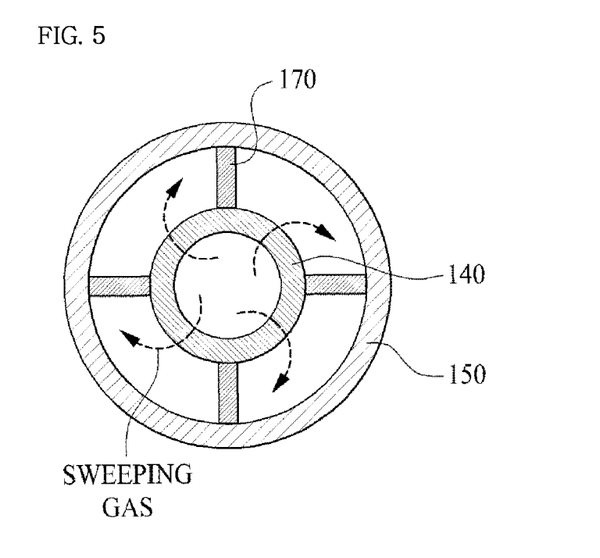

As shown in FIG. 5, the ingot manufacturing apparatus according to the first embodiment of the present invention may further include a divider 170 which divides a suction space between the suction part 150 and the end of the feeding part 140 into a plurality of spaces by connecting the inner surface of the suction part 150 and the outer surface of the feeding part 140.

As such, the suction space between the suction part 150 and the end of the feeding part 140 is divided into a plurality of spaces, so that the path through which the sweeping gas is discharged may be divided. As a result, the sweeping gas can be distributed in the entire suction space without gathering on one side of the suction space.

When the sweeping gas gathers on one side of the suction space, the silicon oxide is difficult to be deposited in the suction space where the sweeping gas has gathered. However, the silicon oxide can be deposited in the suction space where the sweeping gas is insufficient.

Accordingly, when the sweeping gas is distributed in the entire suction space, the silicon oxide is difficult to be deposited in the entire suction space, so that it is possible to prevent a phenomenon in which the feeding part 140 and the suction part 150 are blocked by the silicon oxide.

Figure 6:
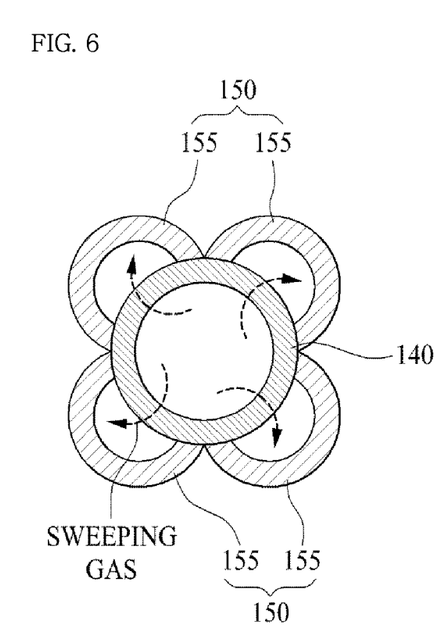

As shown in FIG. 6, the suction part 150 may include a plurality of units, and each of the units may be connected to the outer surface of the feeding part 140. The suction part 150 of FIG. 6 also prevents the sweeping gas from gathering on one side, thereby preventing the feeding part 140 and the suction part 150 from being blocked by the silicon oxide.

Meanwhile, a susceptor 330 of FIG. 1 may surround the outside of the crucible 120. Since the silicon particle is melted at a high temperature, the crucible 120 may be softened. The susceptor 330 may function to support the maintenance of the shape of the crucible 120.

The heater 320 heats the crucible 120 in order to melt the silicon particles supplied through the feeding part 140. The heater 320 may be installed adjacent to the susceptor 330.

The heater 320 is able to heat the silicon particle to about 1,400° C., that is to say, the melting temperature of the silicon particle. Accordingly, the silicon particles can be melted in the crucible 120.

Not only the silicon particle but dopant may be supplied to the crucible 120. The heater 320 heats the crucible 120, so that the dopant as well as the silicon particle may be melted.

A main pump 340 provides a suction pressure for discharging the sweeping gas, silicon oxide and other dusts within the chamber 110 to the outside of the chamber 110. A main filter 350 is able to filter the silicon dust, silicon oxide and other dusts which move toward the main pump 340.

A hopper 360 may store the silicon particles. A supply controller 370 such as a vibrator may control a rate at which the silicon particles are supplied to the crucible 120.

A supply pump 380 may provide a supply pressure of the sweeping gas flowing through the feeding part 140. A suction pump 390 may provide a suction pressure of the sweeping gas which is discharged to the outside of the chamber 110 through the suction part 150. A suction filter 400 is able to filter the silicon dust, silicon oxide and other dusts which are introduced toward the suction pump 390.

Figure 7:
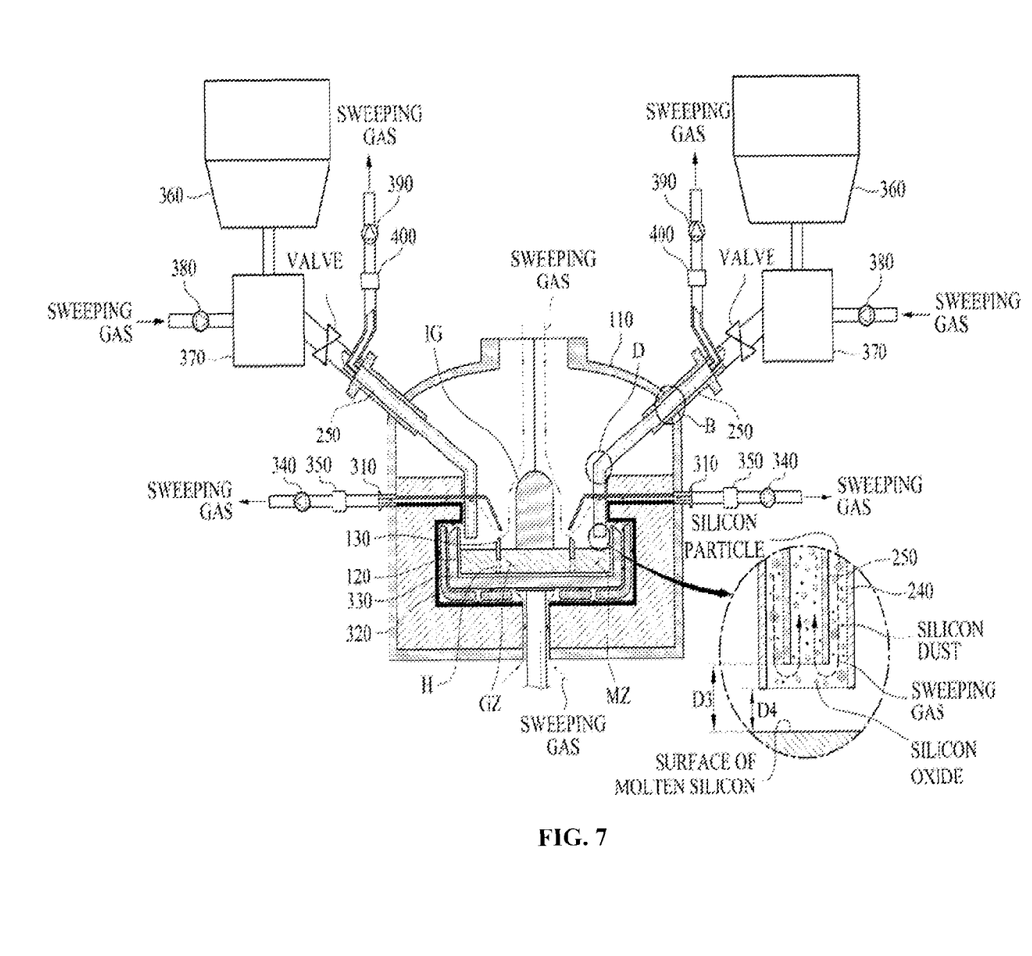
FIG. 7 shows an ingot manufacturing apparatus according to a second embodiment of the present invention.

FIG. 7 shows an ingot manufacturing apparatus according to a second embodiment of the present invention. As shown in FIG. 7, the ingot manufacturing apparatus according to the second embodiment of the present invention includes the chamber 110, the crucible 120, the inner wall 130, a feeding part 240 and a suction part 250. Since the chamber 110, the crucible 120, and the inner wall 130 have been described in the first embodiment, detailed descriptions thereof will be omitted.

The feeding part 240 supplies the silicon particles and sweeping gas to the inside of the chamber 110. The suction part 250 is disposed within the feeding part 240 and discharges the sweeping gas supplied through the feeding part 240 to the outside of the chamber 110.

Here, the temperature of the sweeping gas passing the end of the feeding part 240 may be lower than the temperature of the inside of the chamber 110. The sweeping gas cools the feeding part 240, thereby preventing the silicon oxide from being deposited on the feeding part 240.

As with the first embodiment, the suction part 250 and the feeding part 240 according to the second embodiment of the present invention may also have the same central axis, and accordingly, they may have a coaxial double tube structure.

Figure 8:
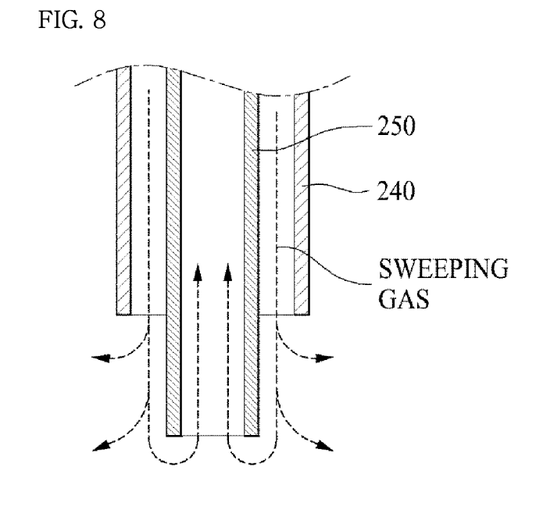
FIG. 8 shows a comparison example of a feeding part and a suction part of FIG. 7.

As shown in FIG. 8, when a distance D3 is less than a distance D4, as shown in FIG. 2, some of the sweeping gas may flow within the chamber 110 instead of the suction part 250, so that the silicon dust may be introduced within the chamber 110.

For the purpose of preventing this, as shown in FIG. 7, the distance D3 from the surface of the molten silicon to the end of the suction part 250 may be the same as or greater than the distance D4 from the surface of the molten silicon to the end of the feeding part 240.

Here, the supply rate of the sweeping gas which is supplied from the feeding part 240 may be substantially the same as or less than the suction rate of the sweeping gas which is discharged through the suction part 250. Since this has been described in the first embodiment, a detailed description thereof will be omitted.

The silicon dust having a diameter less than a diameter of the silicon particle may be introduced within the chamber 110 through the feeding part 240. The suction part 250 may discharge the silicon dust to the outside of the chamber 110. The silicon dust is lighter than the silicon particle. Therefore, when the flow of the sweeping gas is created from the feeding part 240 to the suction part 250, the silicon dust may be discharged along the flow of the sweeping gas to the outside of the chamber 110 through the suction part 250.

The suction part 250 is able to discharge not only the silicon dust but the silicon oxide within the chamber 110 to the outside of the chamber 110. Since this has been described in the first embodiment, a detailed description thereof will be omitted.

Figure 9:
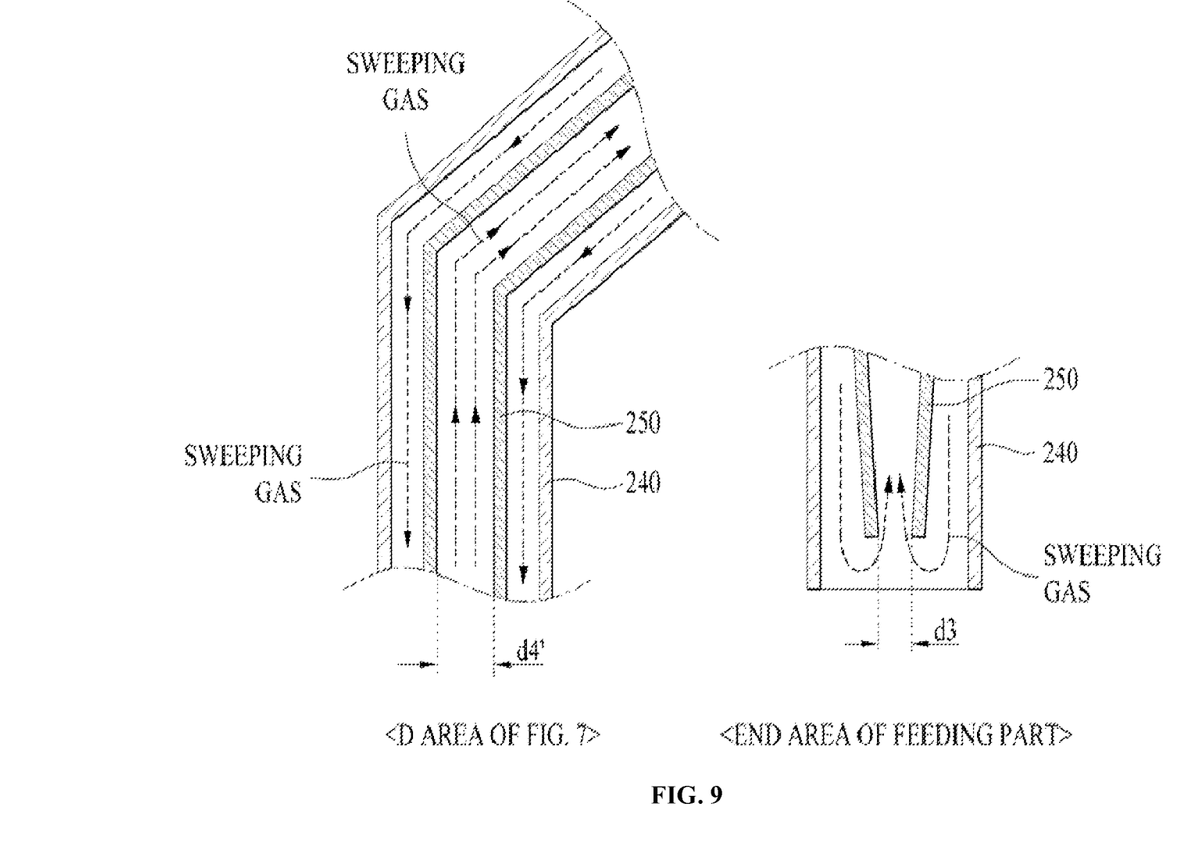
FIGS. 9 to 10 show modified examples of the feeding part of the ingot manufacturing apparatus according to the first embodiment of the present invention.

A diameter d3 of the end of the suction part 250 may be less than a diameter of the suction part 250 in the area "B" of the feeding part 240 shown in FIG. 7, which passes through the chamber 110. Otherwise, as shown in FIG. 9, the diameter d3 may be less than a diameter d4' of the suction part 250 in the area "D" of FIG. 7 where the feeding part 240 is bent within the chamber 110.

As such, the diameter of the suction part 250 decreases, so that negative pressure is formed on the end of the suction part 250, thereby improving the effect of removing the silicon dust, silicon oxide and other dusts.

Figure 10:
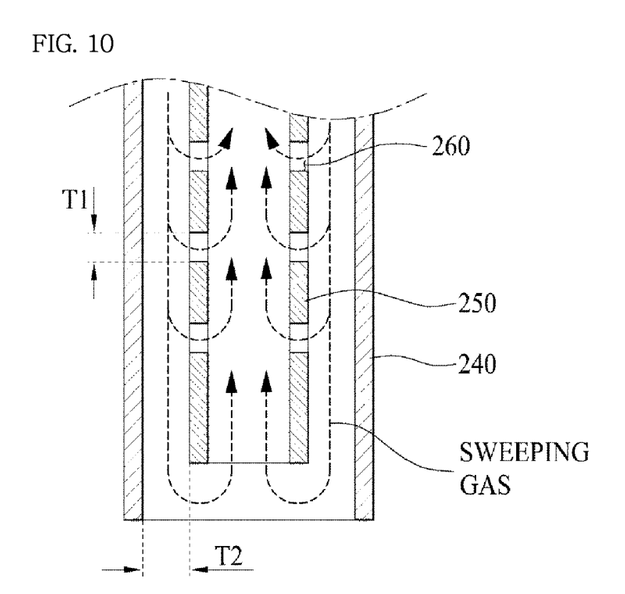

As shown in FIG. 10, some of the sweeping gas may be discharged to the suction part 250 through a through-hole 260 formed in the side of the suction part 250. Here, a diameter T1 of the through-hole 260 may be less than a distance T2 between the inner surface of the feeding part 240 and the outer surface of the suction part 250.

Due to the formation of the through-hole 260, sweeping gas flow path can be diversified. Since the sweeping gas passes through a narrow area such as the through-hole 260, it is possible to efficiently remove the silicon dust, silicon oxide and other dusts.

Figure 11:
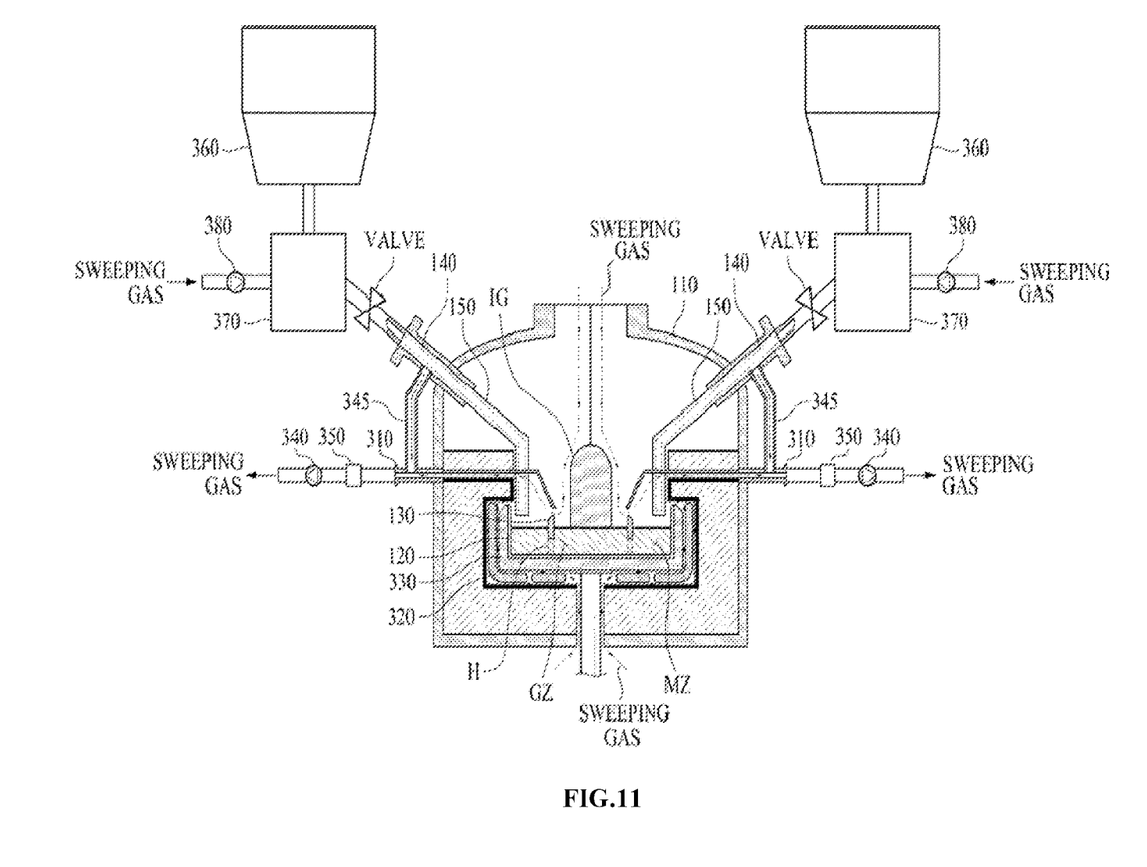
FIG. 11 shows an ingot manufacturing apparatus according to a third embodiment of the present invention.

FIG. 11 shows an ingot manufacturing apparatus according to a third embodiment of the present invention. As shown in FIG. 11, the ingot manufacturing apparatus according to the third embodiment of the present invention includes the chamber 110, the crucible 120, the inner wall 130, the feeding parts 140 and 240, the suction parts 150 and 250, a communicating tube 345, the main filter 350, and the main pump 340.

Since the chamber 110, the crucible 120, the inner wall 130, the feeding parts 140 and 240, and the suction parts 150 and 250 have been described in the first embodiment and the second embodiment, detailed descriptions thereof will be omitted.

Though it is shown in FIG. 11 that the communicating tube 345 communicated to the suction part 150 of the first embodiment, the communicating tube 345 may be also communicated to the suction part 250 of the second embodiment.

That is, the communicating tube 345 may be communicated to the suction part 150 surrounding the feeding part 140 as described in the first embodiment, or may be communicated to the suction part 250 disposed within the feeding part 240 as described in the second embodiment.

Here, the communicating tube 345 communicates the inside of the chamber 110 and the suction parts 150 and 250, and thus, provides a flow path through which the sweeping gas moves to the outside of the chamber 110. For example, the communicating tube 345 can be communicated to the inside of the chamber 110 by being connected to the outlet 310 formed in the chamber 110.

The main filter 350 filters dusts included in the sweeping gas moving through the communicating tube 345. The main pump 340 provides a pressure required for the sweeping gas to move through the communicating tube 345.

In other words, the ingot manufacturing apparatuses according to the first embodiment and the second embodiment of the present invention may include the main filter 350 and the main pump 340 for discharging the sweeping gas within the chamber 110, and the suction filter 400 and the suction pump 390 for discharging the sweeping gas supplied through the feeding parts 140 and 240.

Contrary to this, due to the communicating tube 345, the main filter 350 and the main pump 340, the ingot manufacturing apparatuses according to the first embodiment and the second embodiment of the present invention can process both the sweeping gas within the chamber 110 and the sweeping gas which is discharged through the suction parts 150 and 250.

As a result, the ingot manufacturing apparatus according to the third embodiment of the present invention may have a structure simpler than those of the first and second embodiments.

Until now, the embodiments of the present invention have been and described. It is understood by those skilled in the art that the embodiments can be variously modified without departing from the spirit and scope of the present invention. Therefore, the embodiment should not be limited and should be construed as an example. Accordingly, the present invention is not limited to the above-description and is changeable within the scope of the appended claims as well as all equivalents thereto.

What is claimed is:

1. An ingot manufacturing apparatus comprising:
   a chamber;
   a crucible which is disposed within the chamber and has a melting zone where silicon particles are melted;
   an inner wall which is disposed within the crucible and has a growth zone where an ingot grows from molten silicon introduced from the melting zone;
   a feeding part which supplies the silicon particles and sweeping gas to the inside of the chamber; and
   a suction part which surrounds the feeding part and discharges the sweeping gas supplied through the feeding part to the outside of the chamber.

2. The ingot manufacturing apparatus of claim 1, wherein a distance from a surface of the molten silicon to an end of the feeding part is the same as or greater than a distance from the surface of the molten silicon to an end of the suction part.

3. The ingot manufacturing apparatus of claim 1, wherein the suction part and the feeding part have the same central axis.

4. The ingot manufacturing apparatus of claim 1, wherein a supply rate of the sweeping gas which is supplied from the feeding part is substantially the same as or less than a suction rate of the sweeping gas which is discharged through the suction part.

5. The ingot manufacturing apparatus of claim 1, wherein silicon dust having a diameter less than a diameter of the silicon particle is introduced within the chamber through the feeding part, and wherein the suction part discharges the silicon dust to the outside of the chamber.

6. The ingot manufacturing apparatus of claim 5, wherein the suction part discharges not only the silicon dust but silicon oxide within the chamber to the outside of the chamber.

7. The ingot manufacturing apparatus of claim 1, wherein a distance between an end of the feeding part and an inner surface of the suction part is less than a distance between the inner surface of the suction part and an outer surface of the feeding part in an area where the feeding part is bent within the chamber.

8. The ingot manufacturing apparatus of claim 1, wherein some of the sweeping gas is discharged to the suction part through a through-hole formed in a side of the feeding part, and wherein a diameter of the through-hole is less than a diameter of an end of the feeding part.

9. The ingot manufacturing apparatus of claim 1, further comprising a divider which divides a suction space between the suction part and an end of the feeding part into a plurality of spaces by connecting an inner surface of the suction part and an outer surface of the feeding part.

10. The ingot manufacturing apparatus of claim 1, wherein the suction part comprises a plurality of units, and wherein each of the units is connected to an outer surface of the feeding part.

11. The ingot manufacturing apparatus of claim 1, wherein a temperature of the sweeping gas passing an end of the feeding part is lower than a temperature of the inside of the chamber.

12. An ingot manufacturing apparatus comprising:
    a chamber;
    a crucible which is disposed within the chamber and has a melting zone where silicon particles are melted;
    an inner wall which is disposed within the crucible and has a growth zone where an ingot grows from molten silicon introduced from the melting zone;
    a feeding part which supplies the silicon particles and sweeping gas to the inside of the chamber; and
    a suction part which is disposed within the feeding part and discharges the sweeping gas supplied through the feeding part to the outside of the chamber.

13. The ingot manufacturing apparatus of claim 12, wherein a distance from a surface of the molten silicon to an end of the suction part is the same as or greater than a distance from the surface of the molten silicon to an end of the feeding part.

14. The ingot manufacturing apparatus of claim 12, wherein the suction part and the feeding part have the same central axis.

15. The ingot manufacturing apparatus of claim 12, wherein a supply rate of the sweeping gas which is supplied from the feeding part is substantially the same as or less than a suction rate of the sweeping gas which is discharged through the suction part.

16. The ingot manufacturing apparatus of claim 12, wherein silicon dust having a diameter less than a diameter of the silicon particle is introduced within the chamber through the feeding part, and wherein the suction part discharges the silicon dust to the outside of the chamber.

17. The ingot manufacturing apparatus of claim 16, wherein the suction part discharges not only the silicon dust but silicon oxide within the chamber to the outside of the chamber.

18. The ingot manufacturing apparatus of claim 12, wherein a diameter of an end of the suction part is less than a diameter of the suction part in an area where the feeding part is bent within the chamber.

19. The ingot manufacturing apparatus of claim 12, wherein some of the sweeping gas is discharged to the suction part through a through-hole formed in a side of the suction part, and wherein a diameter of the through-hole is less than a distance between an inner surface of the feeding part and an outer surface of the suction part.

20. The ingot manufacturing apparatus of claim 12, wherein a temperature of the sweeping gas passing an end of the feeding part is lower than a temperature of the inside of the chamber.

21. An ingot manufacturing apparatus comprising:
a chamber;
a crucible which is disposed within the chamber and has a melting zone where silicon particles are melted;
an inner wall which is disposed within the crucible and has a growth zone where an ingot grows from molten silicon introduced from the melting zone;
a feeding part which supplies the silicon particles and sweeping gas to the inside of the chamber;
a suction part which discharges the sweeping gas supplied through the feeding part to the outside of the chamber, surrounds the feeding part or is disposed within the feeding part;
a communicating tube which communicates the inside of the chamber and the suction part and provides a flow path through which the sweeping gas moves to the outside of the chamber;
a main filter which filters dusts included in the sweeping gas moving through the communicating tube; and
a main pump which provides a pressure required for the sweeping gas to move through the communicating tube.

* * * * *